United States Patent
Chia et al.

Patent Number: 5,869,889
Date of Patent: Feb. 9, 1999

[54] THIN POWER TAPE BALL GRID ARRAY PACKAGE

[75] Inventors: Chok J. Chia, Cupertino; Patrick Variot, San Jose; Maniam Alagaratnam, Cupertino, all of Calif.

[73] Assignee: LSI Logic Corporation, Milpitas, Calif.

[21] Appl. No.: 840,614

[22] Filed: Apr. 21, 1997

[51] Int. Cl.⁶ .................................................. H01L 23/34
[52] U.S. Cl. .................. 257/701; 257/712; 257/713; 257/778; 257/738
[58] Field of Search .................................. 257/778, 712, 257/713, 701, 784, 787

[56] References Cited

U.S. PATENT DOCUMENTS

| | | | |
|---|---|---|---|
| 5,352,925 | 10/1994 | Sudoh et al. | 257/787 |
| 5,420,460 | 5/1995 | Massingill | 257/778 |

FOREIGN PATENT DOCUMENTS

| | | | |
|---|---|---|---|
| 57-21845 | 2/1982 | Japan | 257/778 |

OTHER PUBLICATIONS

"Multi–Layer Tab Tape Having Distinct Signal, Power and Ground Planes, Semiconductor Device Assembly Employing Same, Apparatus for and Method of Assembling Same," U.S. Patent Application Serial No. 08/625,641 filed Mar. 29, 1996.

*Primary Examiner*—Peter Toby Brown
*Assistant Examiner*—Roy Potter

[57] ABSTRACT

An integrated circuit package includes a heatspreader which is formed to have a centrally disposed recessed portion between planar surfaces, and flex tape extending from the planar surfaces into the centrally disposed surface. A semiconductor chip is mounted on the centrally disposed surface between the flex tape, and wire bonds interconnect bonding pads on the chip to the metal interconnect patterns on the flex tape. Plastic molding or epoxy is then applied to encapsulate the chip and wire bonding in the centrally disposed planar surface of the heat spreader. The package is then readily mounted on a motherboard using solder balls.

4 Claims, 2 Drawing Sheets

THIN POWER TAPE BALL GRID ARRAY PACKAGE

BACKGROUND OF THE INVENTION

This invention relates generally to semiconductor integrated circuit packages, and more particularly the invention relates to a flex tape ball grid array package where the flex tape and a formed heatspreader provide the package substrate.

The semiconductor integrated circuit chip must be mounted and sealed on a supporting substrate with the substrate providing interconnect electrical leads for supplying electrical signals and voltages to and from the integrated circuit. The ball grid array package is presently used for housing and interconnecting large scale integrated circuits. See copending application Ser. No. 08/625,641 filed Mar. 29, 1996, incorporated herein by reference. Typically, the substrate is a rigid ceramic, for example, which includes metal lead patterns to which the chip contacts are wire bonded. Laminated substrates having multiple metal layers have been used as well as rigid tape substrates. Tape automated bonding (TAB) is typically used with the rigid tape substrates. Solder balls are used to interconnect the substrate leads to electrical contacts on a mother board on which the substrate is mounted as a component in a larger circuit or system.

The two generic constructions for ball grid array packages are die up and die down configurations. In the die up configuration, the chip is attached to the top surface of the substrate and the balls are attached bottom face. In the die down configuration, the chip and balls are on the same surface of the substrate. In the die up configuration, the substrate generally has two metal layers, one on each surface of the substrate. Vias are formed in the substrate to interconnect the two metal layers.

The ceramic and laminate substrates are costly to manufacture. In most substrates there are two or more layers of metal in the substrate which are connected by vias drilled in the substrate, thus increasing the cost. Further, laminate and ceramic substrates are limited in the routing density which limits the separation of the solder balls of the package.

The present invention is directed to a more economical and higher density ball grid array package in which flex tape laminated to a formed heatspreader comprise the package substrate.

SUMMARY OF THE INVENTION

In accordance with the invention, a heatspreader is formed from a stamped or milled metal sheet of copper, aluminum or other suitable heat conductive metal with flex tape attached to opposing sides of the recess in the formed heatspreader. The flex tape is provided with one or two metal layers which are selectively etched to form the interconnect patterns for the array package. The flex tape is laminated to the surface of the heatspreader using an adhesive with bonding sites of the tape being on the lower surface of the heatspreader. A semiconductor chip is mounted on the heatspreader between the flex tape with wire bonding interconnecting bonding pads on the chip to the interconnect pattern on the flex tape. The chip and wire bonding are then encapsulated by a suitable epoxy within the heatspreader.

Bonding sites on the tape are attached to a motherboard by solder balls. The integrated circuit chip mounted in the formed area of the heat spreader is below the plane of the balls, and since the chip is below the plane of balls, the heatspreader can be mounted directly to the motherboard. The chip attaches directly onto the heatspreader for maximum heat dissipation.

The invention and objects and features thereof will be more readily apparent from the following detailed description and appended claims when taken with the drawing.

DETAILED DESCRIPTION OF ILLUSTRATIVE EMBODIMENTS

Figure 1:
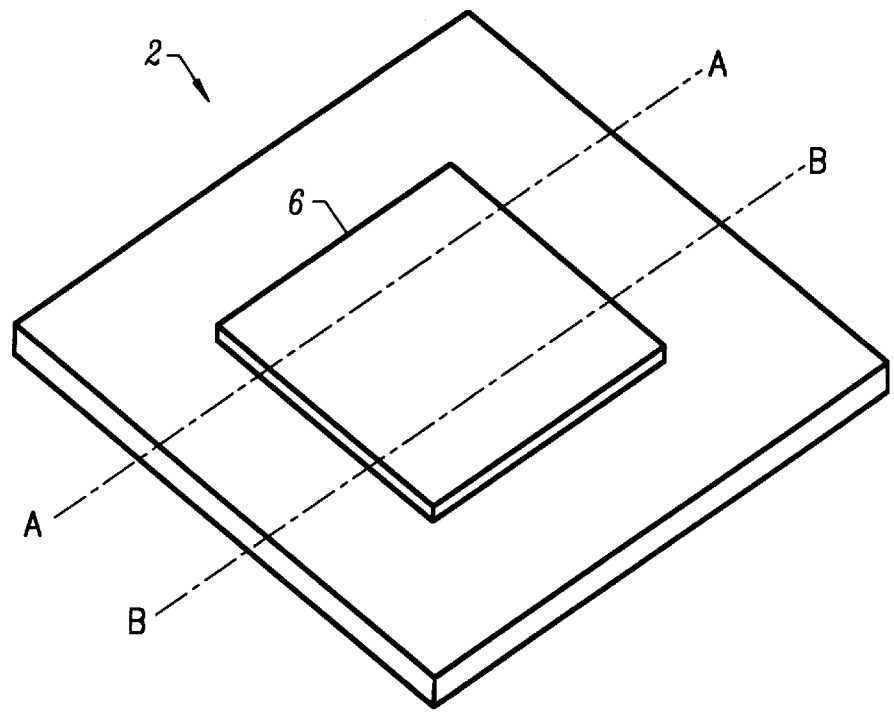
FIG. 1 is a top perspective view of a ball grid array integrated circuit package.
Figure 2:
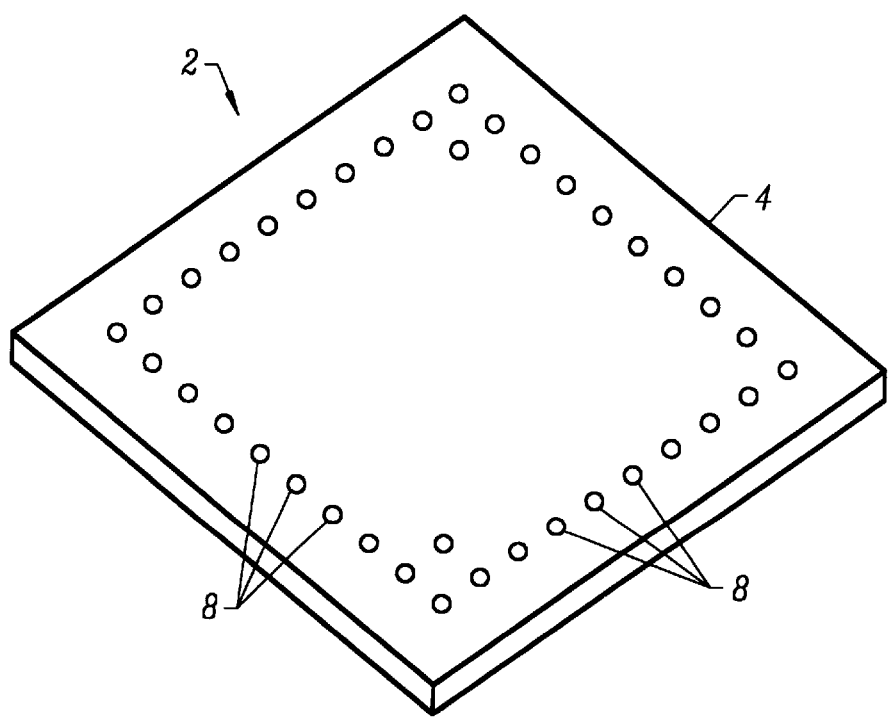
FIG. 2 is a bottom perspective view of the package of FIG. 1.

FIGS. 1 and 2 are a top perspective view and a bottom perspective view of a ball grid array integrated circuit package 2 including a formed heatspreader substrate 4 and an encapsulated integrated circuit 6 mounted in the formed recess. Bonding pads on the integrated circuit 6 are interconnected by wire bonding with solder ball contacts 8 on the bottom surface of substrate 4. An interconnect lead pattern (not shown) on or in substrate 4 is connected to solder balls, also.

Figure 3:
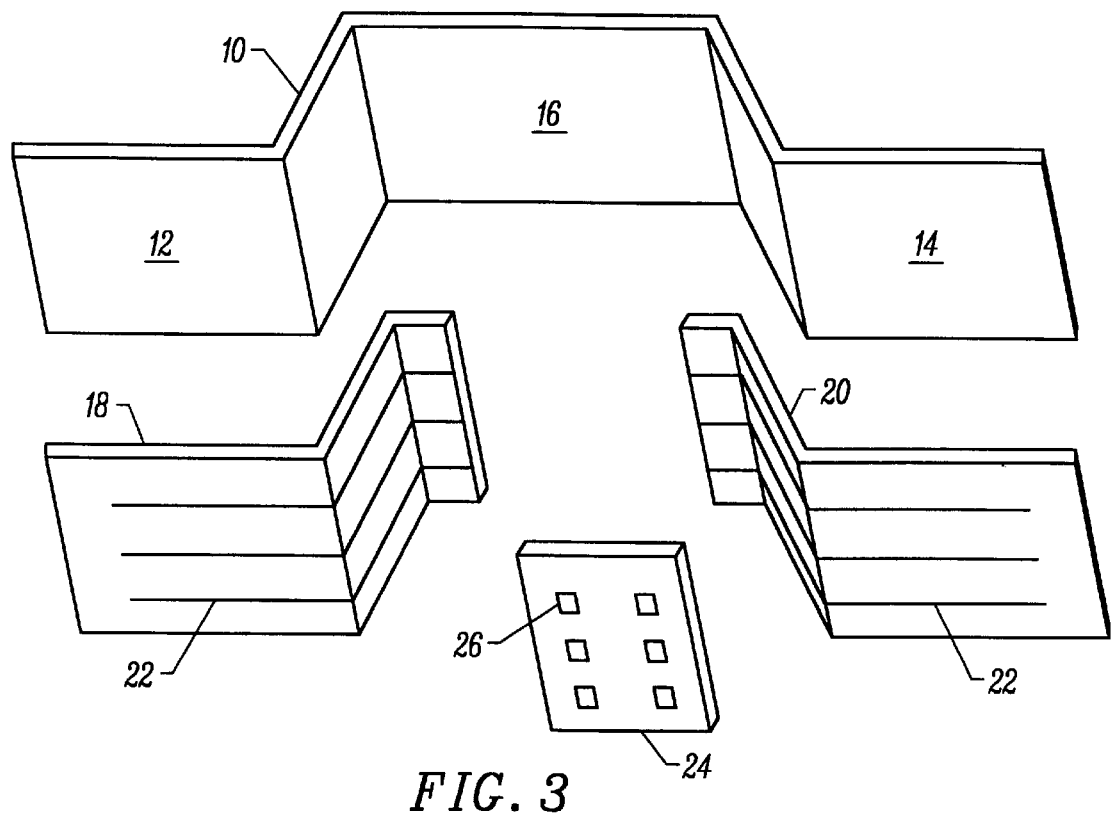
FIG. 3 is an exploded perspective view of components of a power tape /all grid array package in accordance with the invention.
Figure 4:
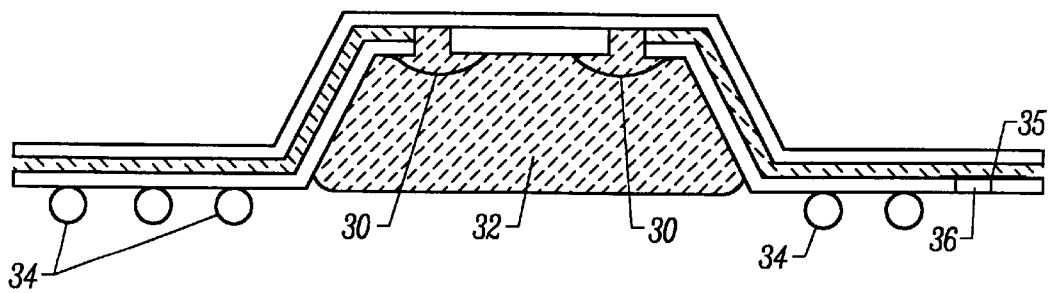
FIG. 4 is a section view of the completed tape ball grid array package of FIG. 1 when fully assembled.

FIG. 3 is an exploded perspective view of components of the tape ball grid array package of FIG. 1 between lines A—A and B—B in accordance with the invention, and FIG. 4 is a section view of the assembled and completed array package. A heat conductive support 10 made of copper, aluminum, or other suitable heat conductive metal is stamped or milled to have opposing planar surfaces 12, 14, and a recessed centrally disposed surface 16 between surfaces 12, 14. Flex tape having opposing sides 18, 20 has at least one metal interconnect pattern shown generally at 22 on an exposed surface is attached by suitable adhesive to the planar surfaces 12, 14 and extending into the offset centrally disposed surface 16. Flex tape sides 18, 20 are spaced apart on surface 16 to accommodate a semiconductor integrated circuit chip 24 which is attached to the surface 16 between flex tape 18, 20. It will be appreciated that the flex tape is attached to all four sides of the recessed surfaces 16 in the formed heatspreader 10. Thereafter, as shown in FIG. 4, wire bonding 30 interconnects bonding pads 26 on the chip 24 to bonding pads on the interconnect patterns 22 on the flex tape. The chip and wire bonding are then encapsulated with a liquid plastic material or epoxy and cured to form a hard protective coating 32.

As further shown in FIG. 4, the grid array package is attached to a motherboard by means of solder balls 34 which engage bonding pads on the interconnect pattern and mating bonding pads of a motherboard. If the flex tape has metal layers on two opposing surfaces, the solder balls can contact the inner conductive pattern 35 through apertures in the tape as shown at 36. In this die down configuration of tape ball grid array package, the chip is above the plane of the solder balls with the chip attaching directly to the heatspreader 10 for maximum heat dissipation.

The use of tape for the substrate allows for greater density of interconnect from the chip to the balls and this allows for closer spaced solder balls and thus higher density packages.

The chip attachment directly to the heatspreader allows for higher heat dissipation and thus a higher power package. The use of flex tape for the substrate is cheaper to manufacture than laminates and ceramics, and the wire bonding for the interconnect of the chip and the substrate is lower in cost and has higher flexibility than other interconnects such as TAB bonding. Further, the recess or cavity for attachment of the chip to the heatspreader allows for greater protection of the chip and easier assembly of a thin and light package.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A thin power tape ball grid array integrated circuit package comprising:

a heat conductive support formed to have a recess with opposing planar surfaces and an offset centrally disposed surface between the opposing planar surfaces, a flex tape attached to the planar surfaces and extending to the centrally disposed surface, the flex tape including at least one metal interconnect pattern on an exposed surface, a plurality of solder balls for interconnecting the metal interconnect pattern on the flex tape to a motherboard, a semiconductor integrated circuit chip mounted on the centrally disposed surface spaced from the flex tape, said chip having a plurality of bonding pads, a plurality of wire bonds within the recess interconnecting bonding pads on the chip to the interconnect pattern, and means for encapsulating the integrated circuit chip and wire bonds within the recess of the heat conductive support.

2. The integrated circuit package as defined by claim 1 wherein the means for encapsulating comprises plastic molding.

3. The integrated circuit package as defined by claim 1 wherein the means for encapsulating comprises an epoxy.

4. The integrated circuit package as defined by claim 1 wherein the flex tape includes a second metal interconnect pattern on a surface attached to the heat conductive support, and apertures in the tape to permit solder ball contact to the second metal interconnect pattern.

* * * * *